United States Patent
Yasui et al.

(10) Patent No.: US 8,591,991 B2
(45) Date of Patent: Nov. 26, 2013

(54) FABRICATION METHOD AND FABRICATION APPARATUS FOR FABRICATING METAL OXIDE THIN FILM

(75) Inventors: Kanji Yasui, Nagaoka (JP); Hiroshi Nishiyama, Nagaoka (JP); Masatoshi Tsukichi, Chiba (JP); Yasunobu Inoue, Nagaoka (JP); Masasuke Takata, Nagaoka (JP)

(73) Assignees: National University Corporation Nagaoka University of Technology, Niigata (JP); Tokyo Electron Limited, Tokyo (JP)

( * ) Notice: Subject to any disclaimer, the term of this patent is extended or adjusted under 35 U.S.C. 154(b) by 298 days.

(21) Appl. No.: 12/600,665

(22) PCT Filed: May 16, 2008

(86) PCT No.: PCT/JP2008/059087
§ 371 (c)(1),
(2), (4) Date: Dec. 18, 2009

(87) PCT Pub. No.: WO2008/143197
PCT Pub. Date: Nov. 27, 2008

(65) Prior Publication Data
US 2010/0166958 A1 Jul. 1, 2010

(30) Foreign Application Priority Data
May 22, 2007 (JP) ................................ 2007-135817

(51) Int. Cl.
*C23C 16/00* (2006.01)
(52) U.S. Cl.
USPC ............. 427/255.23; 427/255.32; 427/255.33

(58) Field of Classification Search
None
See application file for complete search history.

(56) References Cited

U.S. PATENT DOCUMENTS

| | | | |
|---|---|---|---|
| 4,751,149 A | 6/1988 | Vijayakumar et al. | |
| 4,928,627 A * | 5/1990 | Lindner | 118/718 |
| 5,545,443 A * | 8/1996 | Yamada et al. | 427/584 |
| 5,985,691 A * | 11/1999 | Basol et al. | 438/95 |
| 2001/0038810 A1* | 11/2001 | Wallin et al. | 422/177 |
| 2002/0039822 A1* | 4/2002 | Kusumi et al. | 438/264 |
| 2003/0026989 A1* | 2/2003 | George et al. | 428/402 |
| 2003/0044539 A1* | 3/2003 | Oswald | 427/404 |
| 2005/0252449 A1 | 11/2005 | Nguyen et al. | |
| 2005/0271812 A1 | 12/2005 | Myo et al. | |
| 2005/0271813 A1 | 12/2005 | Kher et al. | |
| 2006/0062917 A1* | 3/2006 | Muthukrishnan et al. | 427/248.1 |

FOREIGN PATENT DOCUMENTS

| | | |
|---|---|---|
| JP | 57-127446 | 8/1982 |
| JP | 6-128743 | 5/1994 |
| JP | 2000-281495 | 10/2000 |
| JP | 2002-100621 | 4/2002 |

(Continued)

OTHER PUBLICATIONS

Combustion definition, Wikipedia, downloaded Aug. 2012.*

(Continued)

*Primary Examiner* — Joseph Miller, Jr.
(74) *Attorney, Agent, or Firm* — IPUSA, PLLC

(57) ABSTRACT

A fabrication method for fabricating a metal oxide film introduces $H_2$ gas and $O_2$ gas or, $H_2O_2$ gas, into a catalytic reactor to make contact with a catalyst to generate $H_2O$ gas. The $H_2O$ gas that is generated is jetted from the catalytic reactor to react with a metal compound gas, to thereby deposit the metal oxide thin film on a substrate and fabricate the metal oxide thin film.

10 Claims, 9 Drawing Sheets

(56) References Cited

FOREIGN PATENT DOCUMENTS

| | | |
|---|---|---|
| JP | 2004-71757 | 3/2004 |
| JP | 2004-244716 | 9/2004 |
| WO | WO 2005/113852 | 12/2005 |

OTHER PUBLICATIONS

Chinese Office Action dated Dec. 24, 2010 with partial English translation.

Kanji Yasui et al., "ZnO films grown on glass substrates using high-energy precursors generated by a catalytic reaction," International Symposium on Global Multidisciplinary Engineering 2011 (S-GME2011). IOP Publishing Ltd. pp. 1-4 (2011).

Kanji Yasui et al., "Deposition of Zinc Oxide Thin Films Using a Surface Reaction on Platinum Nanoparticles," 2010 MRS Fall Meeting. pp. 1-6 (2010).

\* cited by examiner

FABRICATION METHOD AND FABRICATION APPARATUS FOR FABRICATING METAL OXIDE THIN FILM

TECHNICAL FIELD

The present invention generally relates to fabrication methods and fabrication apparatuses for fabricating metal oxide thin films which are useful as semiconductor materials, by depositing a metal oxide, such as zinc oxide, on a substrate.

BACKGROUND ART

Various methods have been proposed to form metal oxide thin films on various substrate surfaces, by depositing zinc oxide, titanium oxide and the like, using Pulse Laser Deposition (PLD), laser ablation, sputtering, various Chemical Vapor Depositions (CVDs) or the like (for example, refer to Patent Documents 1 through 3).

According to these proposed methods, a target is prepared in advance, and laser, hypervelocity microparticles or the like are irradiated on the target surface in order to deposit a thin film of the target microparticles generated from the target surface onto the substrate surface or; an organic metal compound or the like is made to contact the substrate surface that is heated to a high temperature, together with a reactive gas, in order to deposit a thin film utilizing the thermal decomposition reaction generated at the substrate surface or; a mixture gas of the organic metal compound or the like and the reactive gas is discharged and decomposed by forming plasma in order to deposit a thin film by recombination of radicals. Therefore, these proposed methods require a large energy to fabricate the metal oxide thin film.

Patent Document 1: Japanese Laid-Open Patent Publication No. 2004-244716
Patent Document 2: Japanese Laid-Open Patent Publication No. 2000-281495
Patent Document 3: Japanese Laid-Open Patent Publication No. 6-128743

DISCLOSURE OF THE INVENTION

Problems to be Solved by the Invention

Accordingly, it is one object of the present invention to provide a technique which suppresses the problem of the conventional technique, and efficiently forms a metal oxide thin film, such as a zinc oxide thin film, on a substrate at a low cost, by utilizing chemical energy generated by catalyst reaction, without requiring electrical energy.

Means of Solving the Problems

According to one aspect of the present invention, a fabrication method for fabricating a metal oxide thin film includes introducing $H_2$ gas and $O_2$ gas or, $H_2O_2$ gas, into a catalytic reactor, to make contact with a catalyst to generate $H_2O$ gas, and jetting the $H_2O$ gas from the catalytic reactor to react with a metal compound gas, to thereby deposit a metal oxide thin film on a substrate.

The fabrication method for fabricating the metal oxide thin film may set the substrate to a temperature in a range of room temperature to 1500° C.

According to one aspect of the present invention, a fabrication apparatus for fabricating a metal oxide thin film includes a catalytic reactor configured to include a catalyst arranged therein and generating $H_2O$ gas by making contact with $H_2$ gas and $O_2$ gas or, $H_2O_2$ gas, and jetting the $H_2O$ gas from the catalytic reactor, a metal compound gas supplying part configured to supply a metal compound gas to react with the generated $H_2O$ gas, and a substrate holder configured to support a substrate, wherein a chemical reaction is caused between the generated $H_2O$ gas and the metal compound gas, to thereby deposit a metal oxide thin film on the substrate.

Effects of the Invention

According to one aspect of the present invention, it is possible to efficiently form a metal oxide thin film on various substrates at a low cost, without requiring large electrical energy. According to one method of the present invention, it is possible to form a hetero-epitaxial film having a high quality on the substrate, even at a low temperature of 400° C. or lower, because it is unnecessary to heat the substrate to a high temperature, when compared to the conventional thermal CVD which cannot form a hetero-epitaxial film having a high quality on the substrate at the low temperature of 400° C. or lower.

DESCRIPTION OF THE REFERENCE NUMERALS

Figure 1:
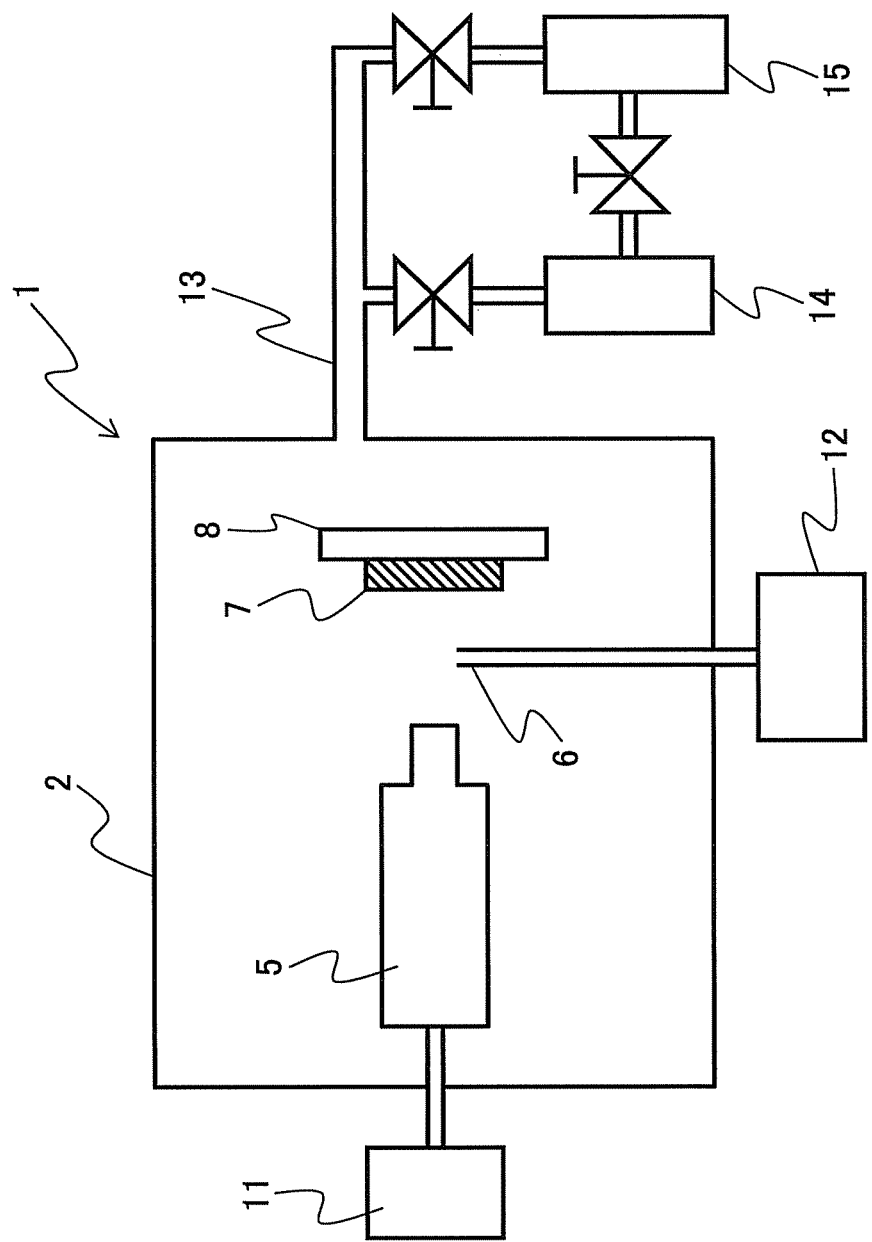
FIG. 1 is a schematic diagram illustrating an example of a structure of a reaction apparatus used to form a metal oxide thin film on a substrate in accordance with a first embodiment of the present invention.

1 Reaction Apparatus
2 Reaction Chamber
3 $H_2O$ Gas Raw Material Inlet
4 Spray Nozzle
5 Catalytic Reactor 6 Organic Metal Compound Gas Inlet
7 Substrate
8 Substrate Holder
11 $H_2O$ Gas Raw Material Supply Part
12 Organic Metal Compound Gas Supply Part
13 Exhaust Pipe
14 Turbo Molecular Pump
15 Rotary Pump
21 Catalyst Container Jacket
22 Catalyst Reaction Container
23 Metal Mesh
24 Metal Oxide Gas
25 Catalyst

BEST MODE OF CARRYING OUT THE INVENTION

First Embodiment

In a first embodiment of the present invention, a $H_2O$ gas raw material is introduced into a catalytic reactor having a reaction gas spray nozzle arranged within a decompressible reaction chamber, to make contact with a catalyst in the form of microparticles. A resulting high-energy $H_2O$ gas that is obtained by the above contact is sprayed from the catalytic reactor to cause reaction with an organic metal compound gas, in order to deposit a metal oxide thin film on a substrate.

In other words, by making a mixture gas of $H_2$ gas and $O_2$ gas or, a $H_2O_2$ gas contact the catalyst microparticles within the catalytic reactor to cause the reaction, the $H_2$ gas that is heated to a high temperature is generated by the heat of reaction. This $H_2O$ gas is sprayed from the spray nozzle to cause mixing and reaction with the organic metal compound gas which becomes a source material of the thin film, to thereby form the metal oxide thin film on the substrate surface.

The catalyst accommodated within the catalytic reactor may be a carrier in the form of microparticles having an average particle diameter of 0.05 mm to 2.0 mm carrying a catalyst component in the form of microparticles having an average particle diameter of 1 nm to 10 nm or, metal powder of platinum (Pt), ruthenium (Ru), iridium (Ir), copper (Cu) or the like having an average particle diameter of approximately 0.1 mm to approximately 0.5 mm. Microparticles of metal oxides, such as aluminum oxide, zirconium oxide and zinc oxide, that is, microparticles of ceramic oxides, may be used for the carrier. For example, the catalyst is preferably an aluminum oxide carrier carrying platinum nanoparticles. More preferably, the catalyst is a carrier that is formed by subjecting porous γ-alumina to a thermal process at 500° C. to 1200° C. to transform the porous γ-alumina into α-alumina crystal phase while maintaining the surface structure thereof, and carries platinum on the order of approximately 1 weight percent (wt. %) to approximately 20 wt. % (for example, the catalyst is 10 wt. % Pt/γ-$Al_2O_3$ catalyst).

Next, a description will be given of an embodiment of the present invention by referring to the drawings, but the present invention is of course not limited to the examples described hereinafter.

Figure 2:
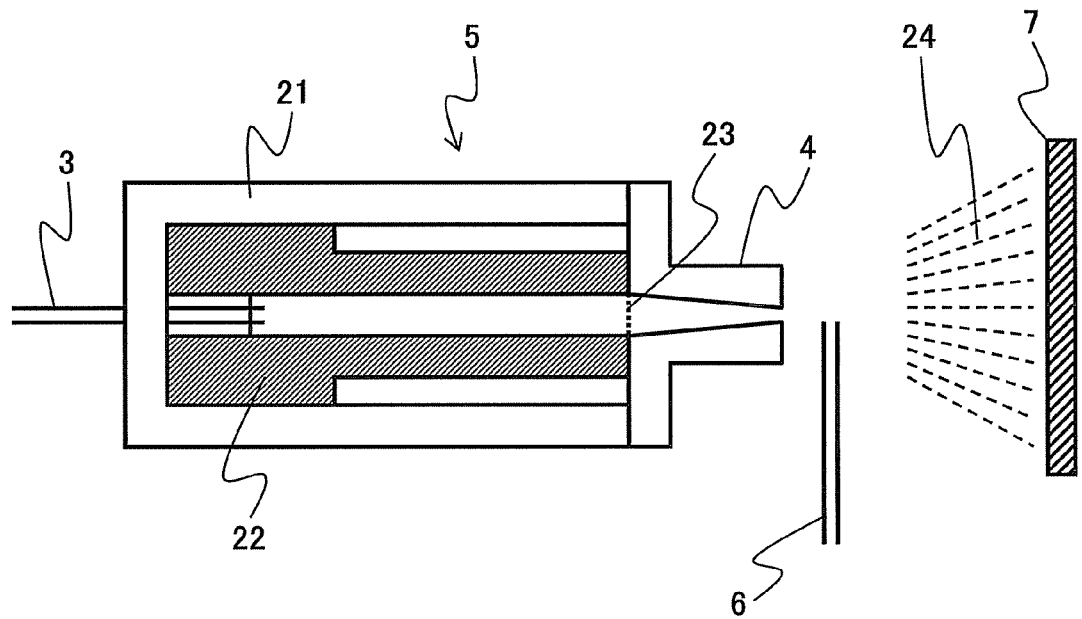
FIG. 2 is a schematic diagram, on an enlarged scale, illustrating a catalytic reactor arranged within the reaction apparatus illustrated in FIG. 1.

FIGS. 1 and 2 are schematic diagrams illustrating examples of apparatuses that are used to form a metal oxide thin film on various substrates in accordance with this embodiment of the present invention. FIG. 1 illustrates a structure of an entire reaction apparatus, and FIG. 2 illustrates, on an enlarged scale, a catalytic reactor arranged within the reaction apparatus illustrated in FIG. 1.

A reaction apparatus 1 includes a decompressible reaction chamber 2. A catalyst reactor 5 having a $H_2O$ gas raw material inlet 3 connected to a $H_2O$ gas raw material supply part 11 and a reaction gas ($H_2O$ gas) spray nozzle 4, an organic metal compound gas introducing nozzle 6 connected to an organic metal compound gas supply part 12 that supplies the raw material of the thin film, and a substrate holder 8 that supports a substrate 7 are accommodated within the reaction chamber 2. The reaction chamber 2 is connected to a turbo molecular pump 14 and a rotary pump 15, via an exhaust pipe 13.

The catalytic reactor 5 includes a cylindrical catalyst container jacket 21 that is made of a metal such as stainless steel, for example. The catalyst container jacket 21 accommodates a catalyst reaction container 22 that is made of a material such as ceramics and metals, and the catalyst container jacket 21 is sealed by a spray nozzle 4.

A catalyst (not illustrated) formed by a carrier in the form of microparticles carrying the catalyst component in the form of ultra-microparticles is arranged within the catalyst reaction container 22. One end portion of the catalyst reaction container 22 is connected to the $H_2O$ gas raw material supply part 11 via the $H_2O$ gas raw material inlet 3, and a metal mesh 23 to restrict or hold the catalyst is arranged on the other end portion of the catalyst reaction container 22.

Figure 3:
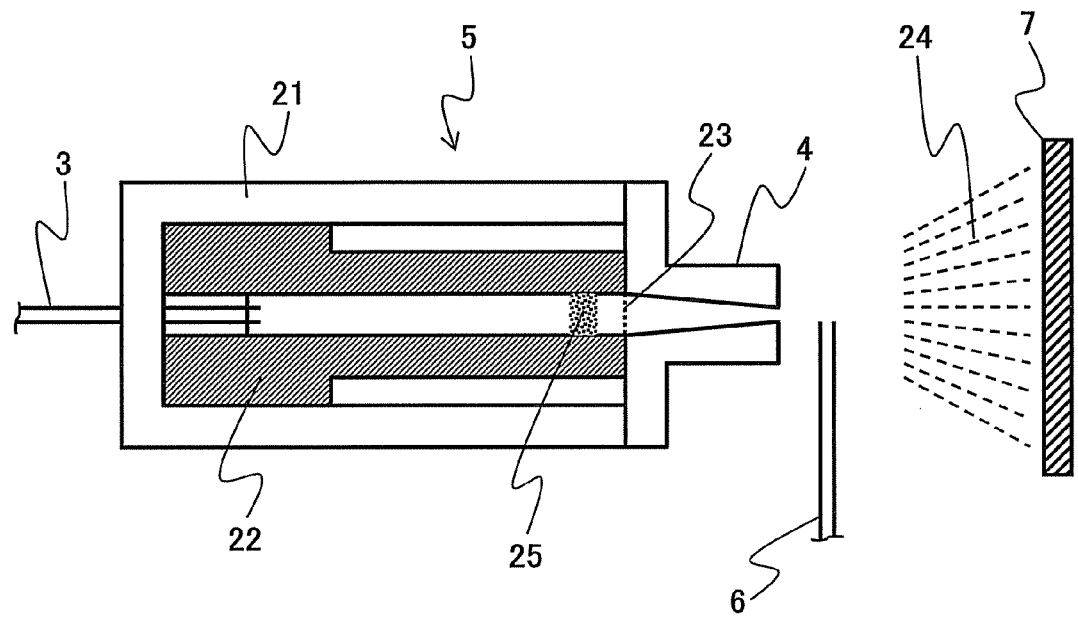
FIG. 3 is a schematic diagram, on an enlarged scale, illustrating another catalytic reactor arranged within the reaction apparatus illustrated in FIG. 1.

FIG. 3 illustrates a catalyst accommodated within another catalytic reactor having a structure in which a carrier in the form of microparticles carries a catalyst component in the form of ultra-microparticles. More particularly, a catalytic reactor 5 in this example includes a cylindrical catalyst container jacket 21 that is made of a metal such as stainless steel, for example. The catalyst container jacket 21 accommodates a catalyst reaction container 22 that is made of a material such as ceramics and metals, and the catalyst container jacket 21 is sealed by a spray nozzle 4.

A catalyst 25 formed by the carrier in the form of microparticles carrying the catalyst component in the form of ultra-microparticles is arranged within the catalyst reaction container 22. One end portion of the catalyst reaction container 22 is connected to the $H_2O$ gas raw material supply part 11 via the $H_2O$ gas raw material inlet 3, and a metal mesh 23 to restrict or hold the catalyst is arranged on the other end portion of the catalyst reaction container 22.

When a $H_2O$ gas raw material made up a mixture gas of $H_2$ gas and $O_2$ gas or, a $H_2O$ gas raw material made up of $H_2O_2$, is supplied to the catalytic reactor 5 from the $H_2O$ raw material supply part 11 via the raw material inlet 3, a chemical reaction of $H_2$ gas and $O_2$ gas or, a cracking reaction of $H_2O_2$ gas, occurs due to the catalyst in the form of microparticles. The reaction that occurs generates a large amount of heat, and the high-temperature $H_2O$ gas that is heated by the heat of reaction is jetted from the reaction gas spray nozzle 4 towards the substrate 7 that is held by the substrate holder 8. The jetted $H_2O$ gas reacts with the organic metal compound gas that is supplied from the organic metal compound gas supply part 12 via the organic metal compound gas introducing nozzle 6, and a metal oxide gas 24 generated by this reaction is deposited on the surface of the substrate 7 as the metal oxide thin film.

A shutter (not illustrated) that is configured to open and close may be provided between the catalytic reactor 5 and the substrate 7, in order to block excessive gas by closing the shutter at an initial stage of the reaction. By providing the shutter, it becomes possible to form on the substrate 7 a metal oxide thin film that has more uniform properties.

The oxide that is formed on the substrate surface is not limited to a particular oxide. However, examples of preferable oxides include metal oxides such as titanium oxide, zinc oxide, magnesium oxide, yttrium oxide, sapphire, and Sn:In$_2$O$_3$ (ITO: Indium Tin Oxide).

The organic metal compound oxide gas that is used as the raw material of the metal oxide thin film is not limited to a particular gas. For example, any organic metal compound gases used to form metal oxides by the conventional CVD may be used as the raw material of the metal oxide thin film. For example, such organic metal compound gases include alkyl compounds, alkenyl compounds, phenyl or alkyl-phenyl compounds, alkoxide compounds, di-pivaloylmethane compounds, halogen compounds, acetylacetonate compounds, Ethylene Diamine Tetraacetic Acid (EDTA) compounds, and the like of various metals. In addition, the raw material of the metal oxide thin film may be gases other than the organic metal compound gases, such as inorganic metal compound gases including halogen compound or the like. For example, zinc chloride (ZnCl$_2$) may be used as the inorganic metal compound gas.

Preferable organic metal compounds include alkyl compounds of various metals and metal alkoxides. More particularly, dimethyl zinc, diethyl zinc, trimethyl aluminum, triethyl aluminum, trimethyl indium, triethyl indium, trimethyl gallium, triethyl gallium, triethoxy aluminum or the like may be used as the organic metal compound.

When forming a zinc oxide thin film on the substrate surface, dialkyl zinc, such as dimethyl zinc and diethyl zinc, is preferably used as the raw material of the metal oxide thin film, and alumina in the form of microparticles and carrying platinum ultra-microparticles is preferably used as the catalyst.

For example, the substrate may be made of a material selected from metals, metal oxides, glass, ceramics, semiconductors, and plastics.

Preferable examples of the substrate include compound single crystal substrates typified by sapphire, single crystal substrates typified by Si, amorphous substrates typified by glass, and engineering plastic substrates typified by polyimide.

According to this embodiment of the present invention, the H$_2$O gas raw material made up mixture gas of H$_2$ gas and O$_2$ gas or, the H$_2$O gas raw material made up of H$_2$O$_2$, which becomes the oxygen source of the metal oxide thin film, is supplied to the catalytic reactor 5 to make contact with the catalyst in the form of microparticles in order to obtain the high-energy H$_2$O gas. This high-energy H$_2$O gas is jetted from the catalytic reactor to react with the organic metal compound gas. As a result, it is possible to efficiently form the metal oxide thin film on various substrates at a low cost, without requiring a large amount of electrical energy. The chemical reaction accompanying the large amount of heat generation is a novel feature of the present invention realized by selecting an appropriate gas as the oxygen source and using the catalyst in the form of microparticles. Of course, the shape or form of the carrier is not limited to the above, and the carrier may have a porous form such as a sponge shape or, a bulk shape such as a honeycomb shape with penetrating holes. In addition, the shape or form of the catalyst material, such as platinum (Pt), ruthenium (Ru), iridium (Ir) and copper (Cu), is not limited to the microparticle form, and the catalyst material may have a film form, for example. More particularly, because the effects obtained in this embodiment of the present invention are obtainable as long as the surface area of the catalyst material is large, the effects similar to those obtainable in the case of the microparticle form can also be obtained in the case of the catalyst material having the film form on the surface of the carrier since the surface area of the catalyst material having the film form can be made large.

According to one method of the present invention, it is possible to form a hetero-epitaxial film having a high quality on the substrate, even at a low temperature of 400° C. or lower, because it is unnecessary to heat the substrate to a high temperature, when compared to the conventional thermal CVD which cannot form a hetero-epitaxial film having a high quality on the substrate at the low temperature of 400° C. or lower. Hence, the method of the present invention enables fabrication of thin films of semiconductor materials and various electronic materials using substrates which were difficult to use in the case of the conventional techniques.

Figure 4:
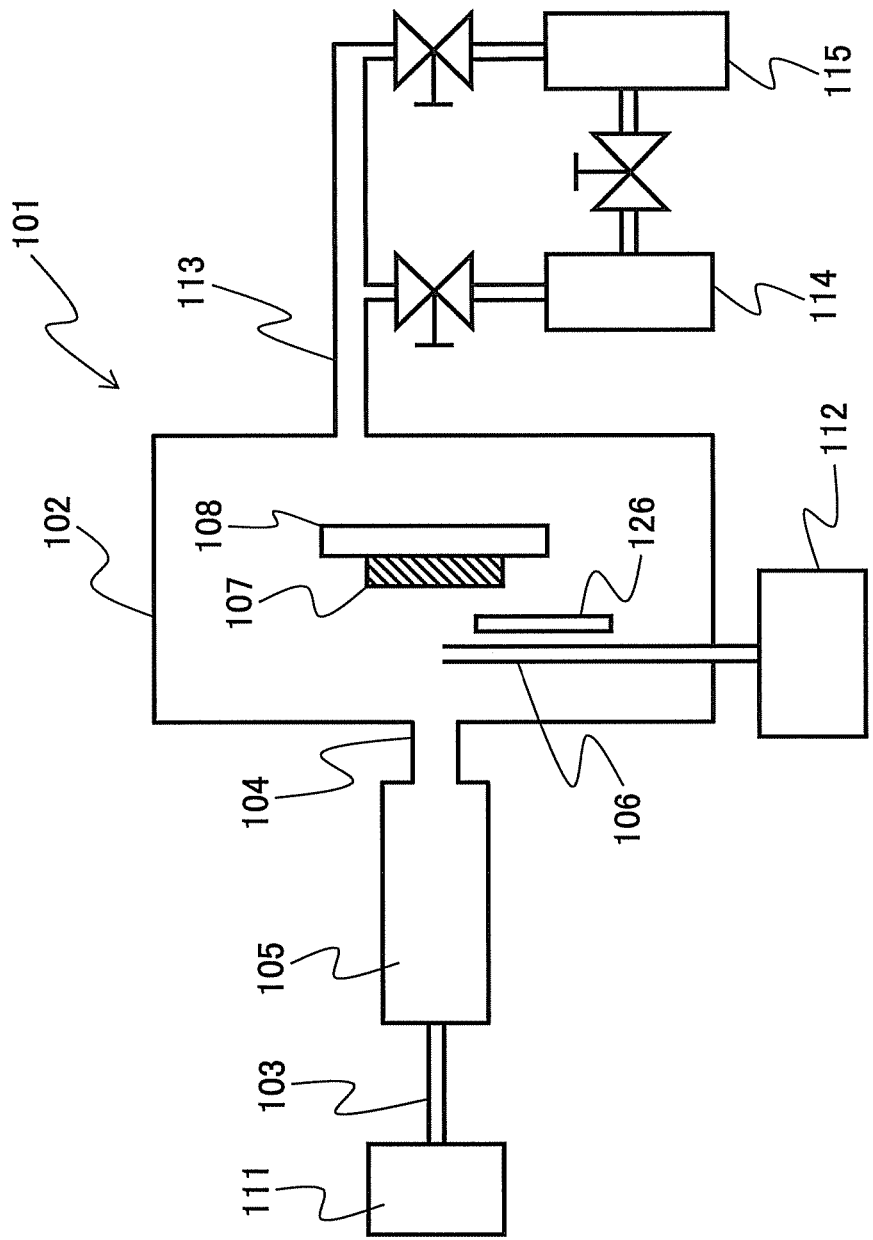
FIG. 4 is a schematic diagram illustrating another example of the structure of the reaction apparatus used to form the metal oxide thin film on the substrate in accordance with the first embodiment the present invention.

FIG. 4 is a schematic diagram illustrating another example of the structure of the reaction apparatus used to form the metal oxide thin film on the substrate in accordance with the first embodiment the present invention. In this example, the catalytic reactor is provided outside the reaction chamber and is connected to the reaction chamber. In other words, a reaction apparatus 101 includes a decompressible reaction chamber 102. In the reaction apparatus 101, a catalytic tractor 105 is connected to a H$_2$O gas raw material supply part 111 via a H$_2$O gas raw material inlet 103, and is connected to the reaction chamber 102 via a reaction gas (H$_2$O gas) spray nozzle 104. An organic metal compound gas introducing nozzle 106 connected to an organic metal compound gas supply part 112 that supplies the raw material of the thin film, and a substrate holder 108 that supports a substrate 107 are accommodated within the reaction chamber 102. The reaction chamber 102 is connected to a turbo molecular pump 114 and a rotary pump 115, via an exhaust pipe 113.

A shutter 126 (illustrated in an open state) that is configured to open and close is provided between the catalytic reactor 105 and the substrate 107, in order to block excessive gas by closing the shutter 126 at an initial stage of the reaction. By providing the shutter 126, it becomes possible to form on the substrate 107 a metal oxide thin film that has more uniform properties.

Second Embodiment

Next, a description will be given of a second embodiment of the present invention. In this embodiment, the H$_2$ gas and the O$_2$ gas are separately supplied into the catalytic reactor to make contact with and react with the catalyst in the microparticle form, in order to generate H$_2$O gas that is heated to a high temperature by the heat of reaction. The heated H$_2$O gas is jetted from the spray nozzle and mixed with organic metal compound gas that becomes the source material of the thin film, in order to form a metal oxide thin film on the substrate surface by the reaction between the heat H$_2$O gas and the organic metal compound gas. Because the H$_2$ gas and the O$_2$ gas are separately supplied into the catalytic reactor, it is possible to more positively prevent a backfire (flame generated when H$_2$O is generated within the catalytic reactor igniting the H$_2$O gas raw material flowing on an upstream side of the catalytic reactor) from occurring due to the reaction between the H$_2$ gas and the O$_2$ gas.

The catalyst accommodated within the catalytic reactor may be a carrier in the form of microparticles having an average particle diameter of 0.05 mm to 2.0 mm carrying a catalyst component in the form of microparticles having an average particle diameter of 1 nm to 10 nm or, metal powder of platinum (Pt), ruthenium (Ru), iridium (Ir), copper (Cu) or the like having an average particle diameter of approximately 0.1 mm to approximately 0.5 mm. Microparticles of metal oxides, such as aluminum oxide, zirconium oxide and zinc oxide, that is, microparticles of ceramic oxides, may be used for the carrier. For example, the catalyst is preferably an aluminum oxide carrier carrying platinum nanoparticles. More preferably, the catalyst is a carrier that is formed by subjecting porous γ-alumina to a thermal process at 500° C. to 1200° C. to transform the porous γ-alumina into α-alumina crystal phase while maintaining the surface structure thereof, and carries platinum on the order of approximately 1 weight percent (wt. %) to approximately 20 wt. % (for example, the catalyst is 10 wt. % Pt/γ-Al$_2$O$_3$ catalyst).

Next, a description will be given of another embodiment of the present invention by referring to the drawings, but the present invention is of course not limited to the examples described hereinafter.

Figure 5:
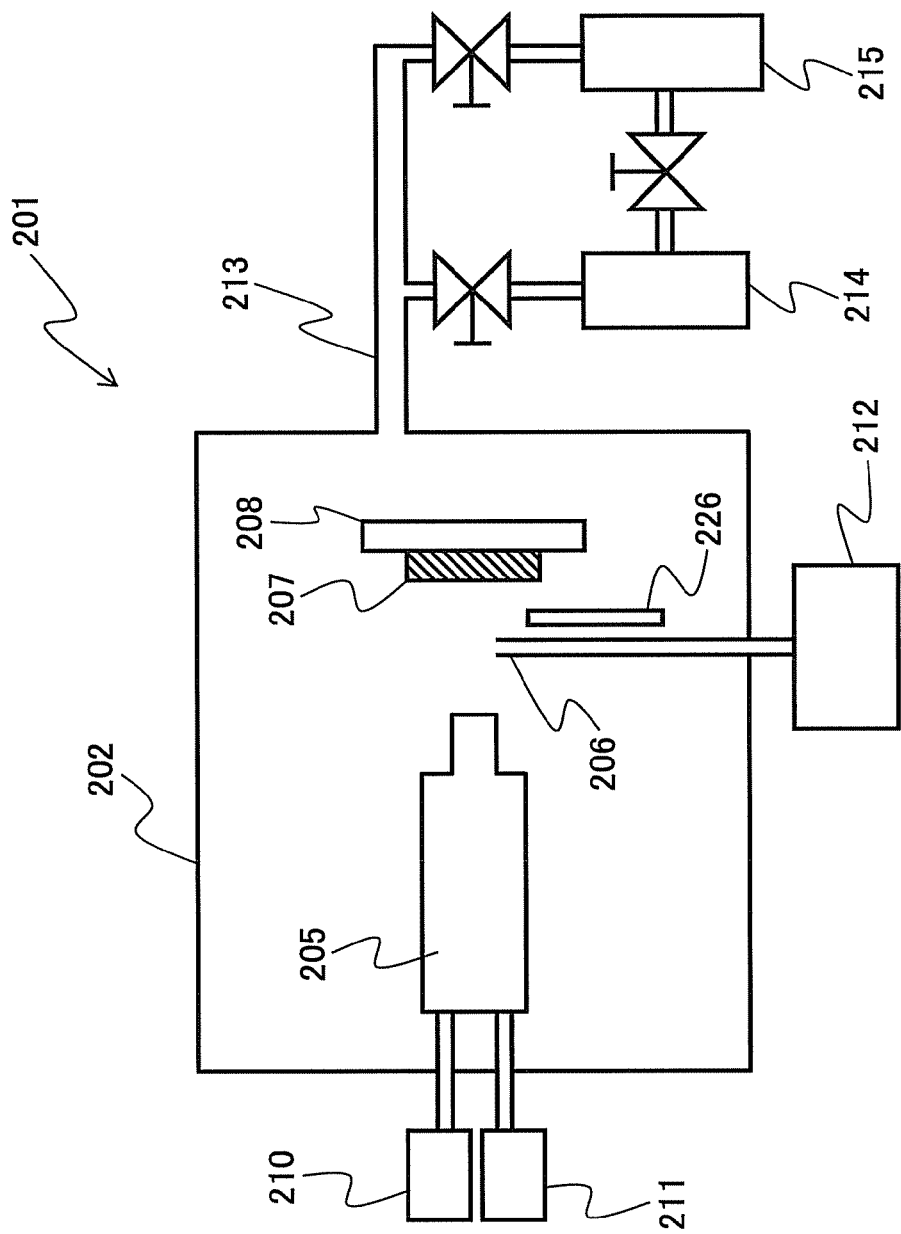
FIG. 5 is a schematic diagram illustrating an example of the structure of the reaction apparatus used to form the metal oxide thin film on the substrate in accordance with a second embodiment of the present invention.
Figure 6:
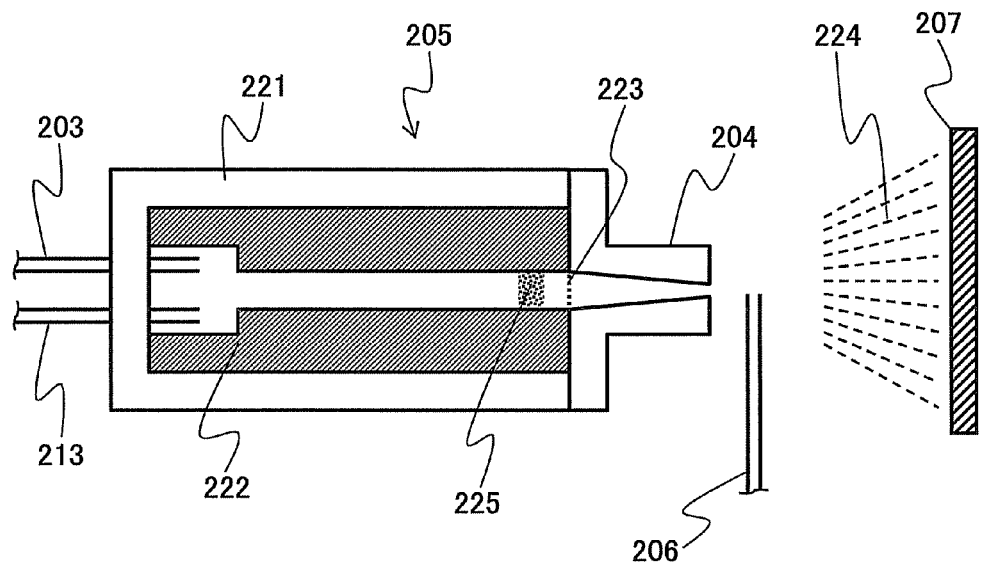
FIG. 6 is a schematic diagram, on an enlarged scale, illustrating a catalytic reactor arranged within the reaction apparatus of the second embodiment.

FIGS. 5 and 6 are schematic diagrams illustrating examples of apparatuses that are used to form a metal oxide thin film on various substrates in accordance with this embodiment of the present invention. FIG. 5 illustrates a structure of an entire reaction apparatus, and FIG. 6 illustrates, on an enlarged scale, a catalytic reactor arranged within the reaction apparatus illustrated in FIG. 5.

A reaction apparatus 201 includes a decompressible reaction chamber 202. A catalyst reactor 205 accommodated within the reaction chamber 202 has a H$_2$ gas raw material inlet 203 connected to a H$_2$ gas raw material supply part 210, an O$_2$ gas raw material inlet 213 connected to an O$_2$ gas raw material supply part 211, and a reaction gas (H$_2$O gas) spray nozzle 204.

An organic metal compound gas introducing nozzle 206 connected to an organic metal compound gas supply part 212 that supplies the raw material of the thin film, and a substrate holder 208 that supports a substrate 207 are also accommodated within the reaction chamber 202. The reaction chamber 202 is connected to a turbo molecular pump 214 and a rotary pump 215, via an exhaust pipe 213.

The catalytic reactor 205 includes a cylindrical catalyst container jacket 221 that is made of a metal such as stainless steel, for example. The catalyst container jacket 221 accommodates a catalyst reaction container 222 that is made of a material such as ceramics and metals, and the catalyst container jacket 221 is sealed by a spray nozzle 204.

A catalyst 225 formed by a carrier in the form of microparticles carrying the catalyst component in the form of ultra-microparticles is arranged within the catalyst reaction container 222. One end portion of the catalyst reaction container 222 is connected to the H$_2$ gas raw material supply part 210 via the H$_2$ gas raw material inlet 203 and to the O$_2$ gas raw material supply part 211 via the O$_2$ gas raw material inlet 213. A metal mesh 223 to restrict or hold the catalyst 225 is arranged on the other end portion of the catalyst reaction container 222.

The H$_2$ gas is supplied to the catalytic reactor 205 from the H$_2$ gas raw material supply part 210 via the H$_2$ gas inlet 203, and the O$_2$ gas is supplied to the catalytic reactor 205 from the O$_2$ raw material supply part 211 via the raw material inlet 213. A chemical reaction of the H$_2$ gas and the O$_2$ gas occurs due to the catalyst 225 in the form of microparticles. The reaction that occurs generates a large amount of heat, and the high-temperature H$_2$O gas that is heated by the heat of reaction is jetted from the reaction gas spray nozzle 204 towards the substrate 207 that is held by the substrate holder 208. The jetted H$_2$O gas reacts with the organic metal compound gas that is supplied from the organic metal compound gas supply part 212 via the organic metal compound gas introducing nozzle 206, and a metal oxide gas 224 generated by this reaction is deposited on the surface of the substrate 207 as the metal oxide thin film.

A shutter 226 (illustrated in an open state) that is configured to open and close is provided between the catalytic reactor 205 and the substrate 207, in order to block excessive gas (gas, unsuited for the thin film deposition, jetted from the catalytic reactor 205 towards the substrate 207 at a stage before the film deposition process stably progresses) by closing the shutter 226 at an initial stage of the reaction. By providing the shutter 226, it becomes possible to form on the substrate 207 a metal oxide thin film that has more uniform properties.

The oxide that is formed on the substrate surface is not limited to a particular oxide. However, examples of preferable oxides include metal oxides such as titanium oxide, zinc oxide, magnesium oxide, yttrium oxide, sapphire, and Sn:In$_2$O$_3$ (ITO: Indium Tin Oxide).

The organic metal compound oxide gas that is used as the raw material of the metal oxide thin film is not limited to a particular gas. For example, any organic metal compound gases used to form metal oxides by the conventional CVD may be used as the raw material of the metal oxide thin film. For example, such organic metal compound gases include alkyl compounds, alkenyl compounds, phenyl or alkyl-phenyl compounds, alkoxide compounds, di-pivaloylmethane compounds, halogen compounds, acetylacetonate compounds, Ethylene Diamine Tetraacetic Acid (EDTA) compounds, and the like of various metals. In addition, the raw material of the metal oxide thin film may be gases other than the organic metal compound gases, such as inorganic metal compound gases including halogen compound or the like. For example, zinc chloride (ZnCl$_2$) may be used as the inorganic metal compound gas.

Preferable organic metal compounds include alkyl compounds of various metals and metal alkoxides. More particularly, dimethyl zinc, diethyl zinc, trimethyl aluminum, triethyl aluminum, trimethyl indium, triethyl indium, trimethyl gallium, triethyl gallium, triethoxy aluminum or the like may be used as the organic metal compound.

When forming a zinc oxide thin film on the substrate surface, dialkyl zinc, such as dimethyl zinc and diethyl zinc, is preferably used as the raw material of the metal oxide thin film, and alumina in the form of microparticles and carrying platinum ultra-microparticles is preferably used as the catalyst.

For example, the substrate may be made of a material selected from metals, metal oxides, glass, ceramics, semiconductors, and plastics.

Preferable examples of the substrate include compound single crystal substrates typified by sapphire, single crystal substrates typified by Si, amorphous substrates typified by glass, and engineering plastic substrates typified by polyimide.

According to this embodiment of the present invention, the H$_2$ gas and the O$_2$ gas, which become the oxygen source of the metal oxide thin film, are supplied to the catalytic reactor 205 to make contact with the catalyst in the form of microparticles in order to obtain the high-energy H$_2$O gas. This high-energy H$_2$O gas is jetted from the catalytic reactor to react with the organic metal compound gas. As a result, it is possible to efficiently form the metal oxide thin film on various substrates at a low cost, without requiring a large amount of electrical energy. The chemical reaction accompanying the large amount of heat generation is a novel feature of the present invention realized by selecting an appropriate gas as the oxygen source and using the catalyst in the form of microparticles. Of course, the shape or form of the carrier is not limited to the above, and the carrier may have a porous form such as a sponge shape or, a bulk shape such as a honeycomb shape with penetrating holes. In addition, the shape or form of the catalyst material, such as platinum (Pt), ruthenium (Ru), iridium (Ir) and copper (Cu), is not limited to the microparticle form, and the catalyst material may have a film form, for example. More particularly, because the effects obtained in this embodiment of the present invention are obtainable as long as the surface area of the catalyst material is large, the effects similar to those obtainable in the case of the microparticle form can also be obtained in the case of the catalyst material having the film form on the surface of the carrier since the surface area of the catalyst material having the film form can be made large.

According to one method of the present invention, it is possible to form a hetero-epitaxial film having a high quality on the substrate, even at a low temperature of 400° C. or lower, because it is unnecessary to heat the substrate to a high temperature, when compared to the conventional thermal CVD which cannot form a hetero-epitaxial film having a high quality on the substrate at the low temperature of 400° C. or lower. Hence, the method of the present invention enables fabrication of thin films of semiconductor materials and various electronic materials using substrates which were difficult to use in the case of the conventional techniques.

Figure 7:
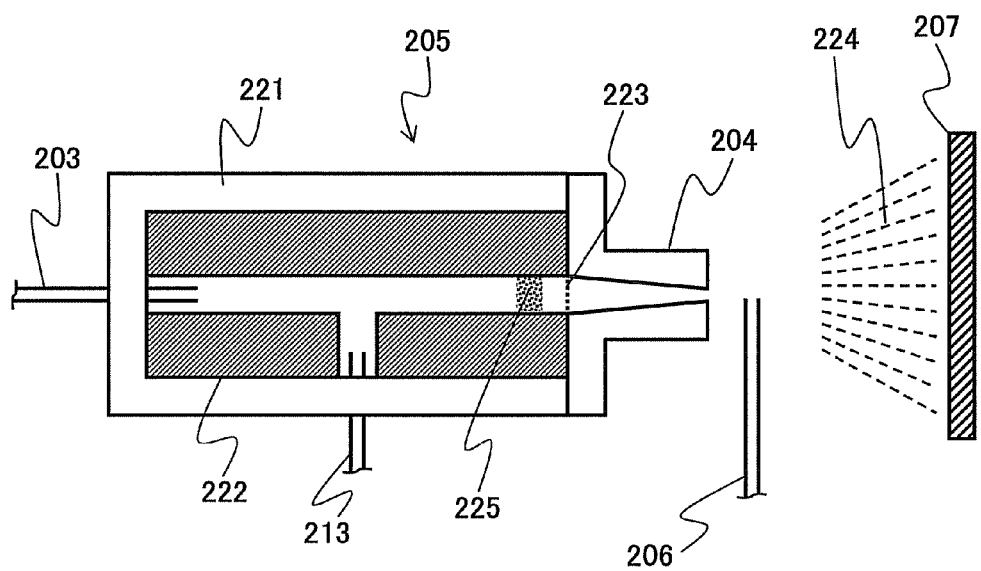
FIG. 7 is a schematic diagram, on an enlarged scale, illustrating another catalytic reactor arranged within the reaction apparatus of the second embodiment.
Figure 8:
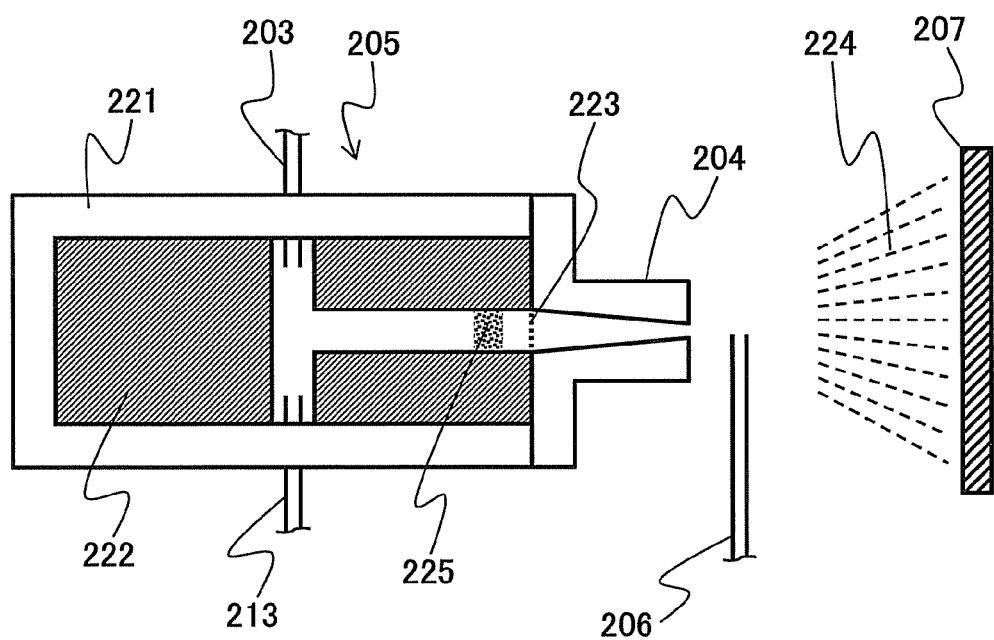
FIG. 8 is a schematic diagram, on an enlarged scale, illustrating still another catalytic reactor arranged within the reaction apparatus of the second embodiment.

In this embodiment, the method of connecting the $H_2$ gas raw material inlet 203 and the $O_2$ gas raw material inlet 213 to the catalytic reactor 205 is not limited to that described above in conjunction with FIG. 6 in which the $H_2$ gas raw material inlet 203 and the $O_2$ gas raw material inlet 213 are connected to the end portion of the catalytic reactor 205 confronting the other end portion of the catalytic reactor 205 that is connected to the reaction gas spray nozzle 204. More particularly, one of the $H_2$ gas raw material inlet 203 and the $O_2$ gas raw material inlet 213 may be connected to the end portion of the catalytic reactor 205 confronting the other end portion of the catalytic reactor 205 that is connected to the reaction gas spray nozzle 204, with the other of the $H_2$ gas raw material inlet 203 and the $O_2$ gas raw material inlet 213 connected to a side surface portion of the catalytic reactor 205, as illustrated in FIG. 7. Furthermore, both the $H_2$ gas raw material inlet 203 and the $O_2$ gas raw material inlet 213 may be connected to the side surface portion of the catalytic reactor 205, as illustrated in FIG. 8.

Figure 9:
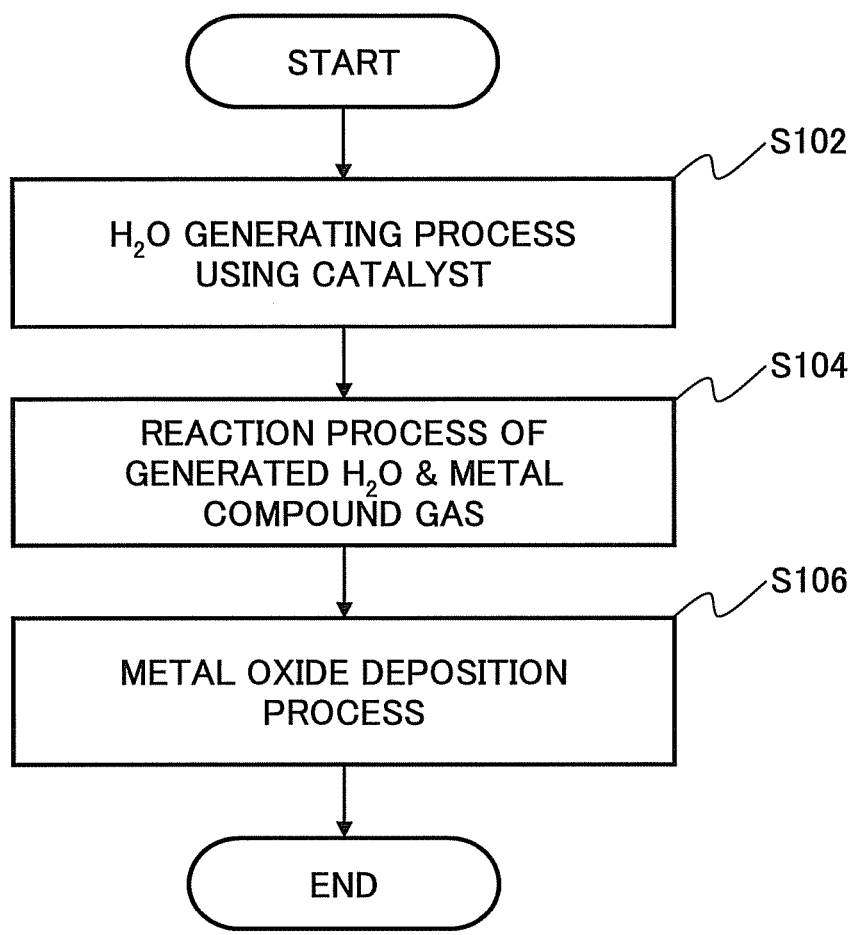
FIG. 9 is a flow chart of a fabrication method in accordance with the present invention.

Next, a more detailed description will be given of a film deposition process to deposit the metal oxide thin film in accordance with this embodiment of the present invention, by referring to FIG. 9.

First, a step S102 (process 102) supplies to the catalytic reactor 205 the $H_2$ gas from the $H_2$ gas raw material supply part 210 via the $H_2$ gas inlet 203, and the $O_2$ gas from the $O_2$ raw material supply part 211 via the raw material inlet 213. Hence, a chemical reaction of the $H_2$ gas and the $O_2$ gas occurs due to the catalyst 225 in the form of microparticles within the catalytic reactor 205. More particularly, $H_2O$ is generated by a reaction $2H_2+O_2 \rightarrow 2H_2O$. The reaction that occurs generates a large amount of heat, and the high-temperature $H_2O$ gas that is heated by the heat of reaction is jetted from the reaction gas spray nozzle 204 towards the substrate 207 that is held by the substrate holder 208.

Next, a step S104 (process 104) generates the metal oxide gas 224 by chemical reaction between the $H_2O$ gas and the organic metal compound gas. That is, the chemical reaction between the $H_2O$ gas that is jetted from the reaction gas spray nozzle 204 and the organic metal compound gas that is supplied from the organic metal compound gas introducing nozzle 206, to thereby generate the metal oxide gas 224. More particularly, the metal oxide gas 224 is generated by a reaction $Zn(CH_3)_2+H_2O \rightarrow ZnO+2CH_4$, for example. The metal oxide gas 224 may be generated by a reaction $Zn(CH_2CH_3)_2+H_2O \rightarrow ZnO+2C_2H_6$, for example, by changing the material used for the organic metal compound gas that is supplied.

Next, a step S106 (process 106) deposits the generated metal oxide gas 224 on the surface of the substrate 207 as the metal oxide thin film.

The thin film deposition of the metal oxide thin film is carried out by the above described steps or processes.

EMBODIMENT SAMPLES

Next, a description will be given of embodiment samples of the present invention, however, the present invention is of course not limited to the specific examples described in the following. In the following example, a zinc oxide thin film was formed on a sapphire substrate, using the reaction apparatus of the first embodiment described above and illustrated in FIG. 1.

Embodiment Sample 1

1.0 g of a γ-$Al_2O_3$ carrier having an average particle diameter of 0.3 mm impregnated with and carrying 0.27 g of hexachloroplatinic acid (oxonium salt of hexachloroplatinate (IV) anion) was baked in air at 450° C. for 4 hours, in order to obtain 10 wt. % Pt/γ-$Al_2O_3$ catalyst. After supplying 0.27 g of the γ-$Al_2O_3$ having the average particle diameter of 0.3 mm to the catalyst reaction container 22, 0.02 g of the 10 wt. % Pt/γ-$Al_2O_3$ catalyst was supplied to the catalyst reaction container 22. Then, the metal mesh 23 was set and the spray nozzle 4 was set in order to form the catalytic reactor 5, and the catalytic reactor 5 was set within the decompressible reaction chamber 2.

The $H_2$ gas was supplied to the catalytic reactor 5 at 0.06 atmospheric pressure, and the $O_2$ gas was supplied to the catalytic reactor 5 at 0.06 atmospheric pressure. Combustion of the $H_2$ gas and the $O_2$ gas was made at the catalyst surface, and $H_2O$ gas of 1000° C. was generated at the catalyst reaction portion. In a state where the shutter provided in front of the spray nozzle 4 is closed, this high-temperature $H_2O$ gas was jetted from the spray nozzle 4.

Figure 10:
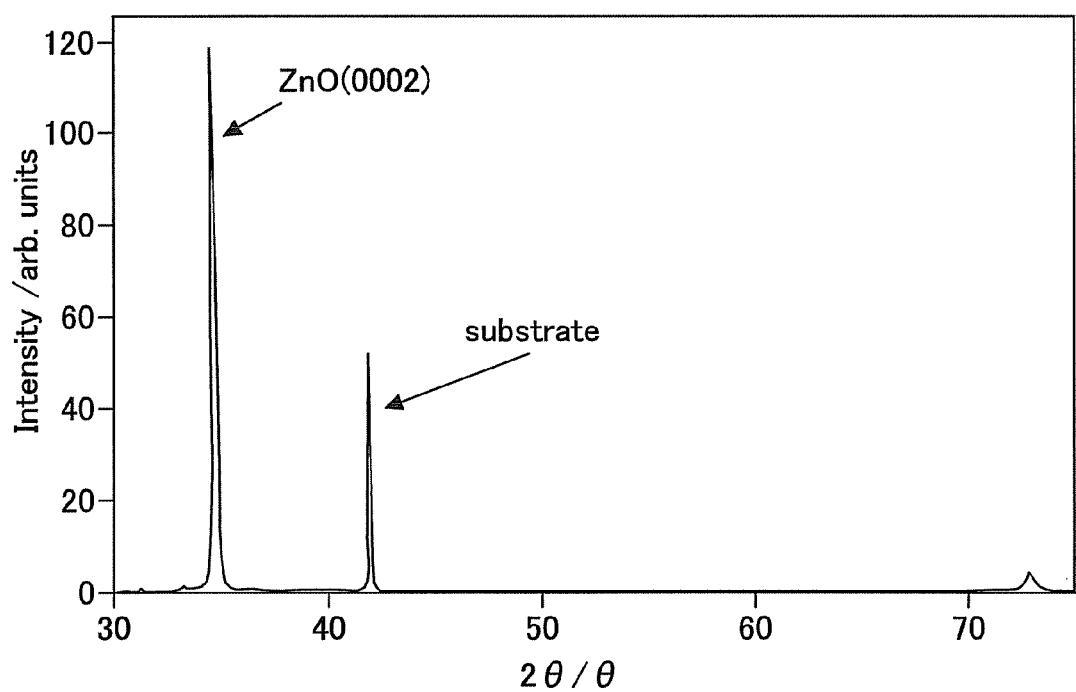
FIG. 10 is a diagram illustrating a XRD pattern of a ZnO thin film obtained in an embodiment sample 1.
Figure 11:
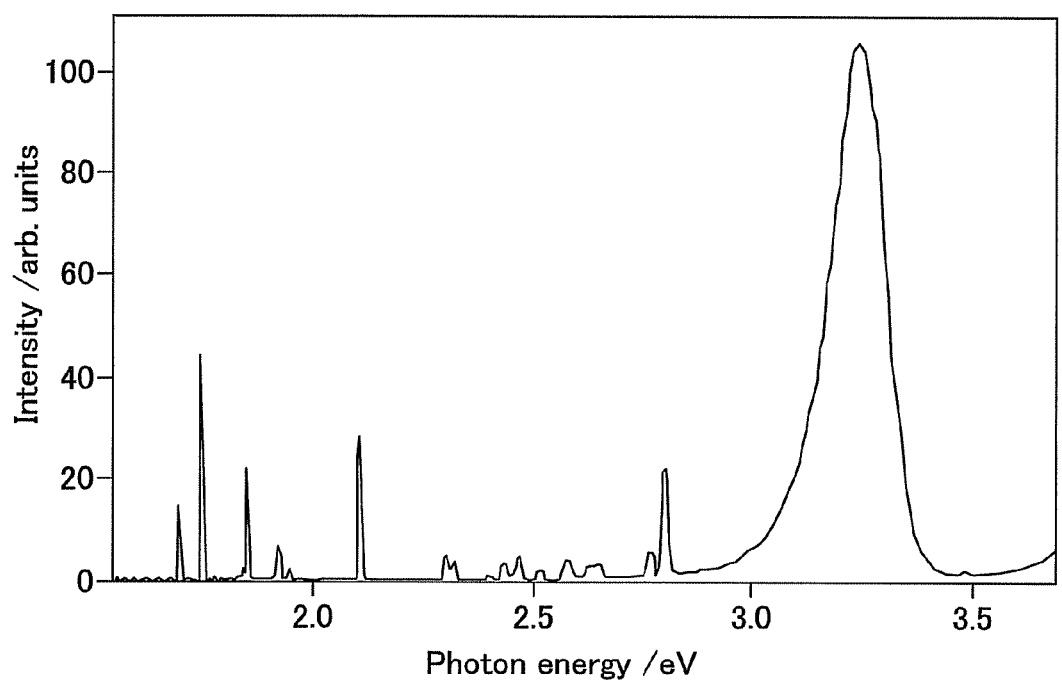
FIG. 11 is a diagram illustrating a photoluminescence spectrum of the ZnO thin film obtained in the embodiment sample 1.

On the other hand, diethyl zinc which becomes the raw material of ZnO was supplied from the organic metal compound gas supply part 12 at $1 \times 10^{-5}$ Torr to the reaction chamber 2 via the organic metal compound gas introducing nozzle 6, in order to make contact with the high-temperature $H_2O$ gas described above and form a ZnO precursor. By opening the shutter opposing the surface of the sapphire substrate 7 (having a size of 10 mm×10 mm) that is oriented in a c-axis direction thereof, has a surface temperature of 400° C., and is supported on the substrate holder 8 within the reaction chamber 2, the ZnO precursor is deposited on the substrate surface to form a ZnO thin film. In this embodiment sample, the deposition time was set to 20 minutes. A film thickness of the ZnO thin film that is obtained as a result of the film deposition was 2 μm. FIG. 10 is a diagram illustrating a XRD pattern of the ZnO thin film obtained in this embodiment sample 1, and FIG. 11 is a diagram illustrating a photoluminescence spectrum of the ZnO thin film obtained in this embodiment sample 1. Furthermore, the electrical characteristic and the deposition rate of the ZnO thin film were as follows.

Sapphire Substrate Temperature: 400° C.
Carrier Mobility: 38.4 $cm^2$/Vs
Carrier Density: $4.79 \times 10^{18}$ $cm^{-3}$
Resistivity: $5.09 \times 10^{-2}$ Ωcm
Deposition Rate of ZnO Thin Film: 330 nm/min In this embodiment sample 1 described above, the mixture gas of $H_2$ and $O_2$ was used as the $H_2O$ gas raw material, however, $H_2O_2$ gas may be used in place of this mixture gas. In addition, a metal oxide thin film can be formed efficiently on the substrate in a manner similar to the case where Zn is used as the organic metal compound gas, when a metal compound gas other than Zn is used to form the metal oxide thin film on a substrate other than the sapphire substrate.

Therefore, according to the present invention, the $H_2O$ gas raw material made up the mixture gas of $H_2$ gas and $O_2$ gas or, the $H_2O$ gas raw material made up of $H_2O_2$, which becomes the oxygen source of the metal oxide thin film, is supplied to the catalytic reactor 5 to make contact with the catalyst in the form of microparticles in order to obtain the high-energy $H_2O$ gas. This high-energy $H_2O$ gas is jetted from the catalytic reactor to react with the organic metal compound gas. As a result, it is possible to efficiently form the metal oxide thin film on the substrate at a low cost, without requiring a large amount of electrical energy.

INDUSTRIAL APPLICABILITY

The present invention is applicable to techniques for forming metal oxide thin films which are useful as semiconductor materials, by depositing a metal oxide, such as zinc oxide, on a substrate.

Further, the present invention is not limited to these embodiments, but various variations and modifications may be made without departing from the scope of the present invention.

This application claims the benefit of a Japanese Patent Application No. 2007-135817 filed on May 22, 2007, in the Japanese Patent Office, the disclosure of which is hereby incorporated by reference.

The invention claimed is:

1. A fabrication method for fabricating a metal oxide thin film, comprising:
   introducing $H_2$ gas and $O_2$ gas, or $H_2O_2$ gas, into a catalytic reactor to make contact with a catalyst, to thereby generate high-temperature $H_2O$ gas by combusting the $H_2$ gas and the $O_2$ gas, or the $H_2O_2$ gas, in the catalytic reactor; and
   jetting the high-temperature $H_2O$ gas from the catalytic reactor to react with a metal compound gas in front of a substrate surface, to thereby generate a metal oxide gas and deposit a metal oxide thin film on the substrate surface by the metal oxide gas,
   wherein the catalyst includes a carrier with a catalyst component,
   wherein the carrier is in the form of microparticles having an average particle diameter of 0.05 mm to 2.0 mm,
   wherein the catalyst component consists of platinum particles carried on the carrier, and
   wherein the platinum particles have an average particle diameter of 1 nm to 10 nm.

2. The fabrication method as claimed in claim 1, wherein said introducing introduces the $H_2$ gas and the $O_2$ gas, or the $H_2O_2$ gas, into the catalytic reactor that is arranged within a decompressible reaction chamber.

3. The fabrication method for fabricating the metal oxide thin film as claimed in claim 1, wherein the metal compound is an organic zinc compound, and a zinc oxide thin film is formed on the substrate surface.

4. The fabrication method for fabricating the metal oxide thin film as claimed in claim 3, wherein the organic zinc compound is dialkyl zinc, and the carrier includes ceramic oxide in the form of microparticles carrying the platinum particles.

5. The fabrication method for fabricating the metal oxide thin film as claimed in claim 3, wherein the organic zinc compound is dialkyl zinc, and the carrier includes alumina in the form of microparticles carrying the platinum ultra-particles.

6. The fabrication method for fabricating the metal oxide thin film as claimed in claim 1, further comprising:
   blocking excessive gas by closing a shutter, which is configured to open and close, and is provided between the catalytic reactor and the substrate surface.

7. The fabrication method for fabricating the metal oxide thin film as claimed in claim 1, wherein the substrate surface is made of a material selected from a group consisting of metals, metal oxides, glass, ceramics, semiconductors, and plastics.

8. The fabrication method for fabricating the metal oxide thin film as claimed in claim 6, wherein the blocking blocks the excessive gas by closing the shutter until a film deposition process by the metal oxide gas stably progresses.

9. The fabrication method for fabricating the metal oxide thin film as claimed in claim 1, further comprising:
   setting a substrate having the substrate surface to a temperature lower than 400° C.

10. The fabrication method for fabricating the metal oxide thin film as claimed in claim 1, wherein the jetting jets the high-temperature $H_2O$ gas from a nozzle of the catalytic reactor, and the fabrication method further comprises:
    supplying the metal compound gas from a location between the nozzle and the substrate surface, to thereby generate the metal oxide gas in front of the substrate surface in a region between the location and the substrate surface.

* * * * *